United States Patent [19]
Son et al.

[11] Patent Number: 6,011,738
[45] Date of Patent: Jan. 4, 2000

[54] SENSING CIRCUIT WITH CHARGE RECYCLING

[75] Inventors: Joo-Hiuk Son; Hae-Young Rha, both of Choongcheongbuk-Do; Jin-Hong Ahn, Kyungki-Do, all of Rep. of Korea

[73] Assignee: LG Semicon Co., Ltd., Cheongju, Rep. of Korea

[21] Appl. No.: 09/161,390

[22] Filed: Sep. 28, 1998

[30] Foreign Application Priority Data

Feb. 7, 1998 [KR] Rep. of Korea .......................... 98-3577

[51] Int. Cl.⁷ ...................................................... G11C 7/02
[52] U.S. Cl. ............................................ 365/207; 365/203
[58] Field of Search .................................... 365/207, 205, 365/203; 326/113, 95; 327/55, 51

[56] References Cited

U.S. PATENT DOCUMENTS

| | | | |
|---|---|---|---|
| 5,426,603 | 6/1995 | Nakamura et al. ...................... | 365/149 |
| 5,491,435 | 2/1996 | Mun et al. ................................. | 327/55 |
| 5,528,552 | 6/1996 | Kamisaki .............................. | 365/238.5 |
| 5,768,201 | 6/1998 | Oh ............................................. | 365/205 |
| 5,859,548 | 1/1999 | Kong ....................................... | 326/113 |
| 5,877,993 | 3/1999 | Biegel et al. ............................ | 365/201 |

*Primary Examiner*—David Nelms
*Assistant Examiner*—David Lam
*Attorney, Agent, or Firm*—Fleshner & Kim

[57] ABSTRACT

A circuit for reading data from a memory device reduces electric power consumption by recycling in a precharge period the charge consumed in a preceding sensing period. The circuit includes a pair of data lines set to a voltage level higher than a precharge voltage by the sensing operation of a pull-up amplifier, and a pair of data lines set to a voltage level lower than the precharge voltage by the sensing operation of a pull-down amplifier. The charge consumed in the sensing period is recycled by electrically connecting the two pairs of data lines, respectively, during a succeeding precharge period.

21 Claims, 4 Drawing Sheets

SENSING CIRCUIT WITH CHARGE RECYCLING

BACKGROUND OF THE INVENTION

1. Field of the Invention

The present invention relates to a sensing circuit, and more particularly, to a sense amplifier for a memory device.

2. Background of the Related Art

FIG. 1 illustrates a sense amplifier according to the background art, which includes a pair of pull-down amplifiers 10 and 11, a precharge unit 12 and an equalizing unit 13. Each of the pull-down amplifiers 10 and 11 has a pair of input terminals and a pair of output terminals. The output terminals of the pull-down amplifiers 10 and 11 are respectively connected with data lines DL0, DL0b and DL1, DL1b. The precharge unit 12 and the equalizing unit 13 are connected with the data lines DL0, DL0b and DL1, DL1b.

FIG. 2 is a detailed circuit view of the sense amplifier illustrated in FIG. 1. The pull-down amplifiers 10 and 11 are amplifiers for sensing a voltage on an output terminal which is lower than a precharge voltage PV. The pull-down amplifier 10 is enabled by a sense amplifier enable signal SAEN to sense data provided from a corresponding memory cell of the memory device on input terminals IN0, IN0b of the NMOS transistors NM1, NM2, and the amplifier 10 outputs the sensed data to the data lines DL0, DL0b. The pull-down amplifier 11 is enabled by the sense amplifier enable signal SAEN to sense data from a corresponding memory cell of a memory device on input terminals IN1, IN1b applied to the NMOS transistors NM4, NM5, and the amplifier 11 outputs the data to the data lines DL1, DL1b.

Pursuant to an equalizing signal DLEQ, the precharge unit 12 precharges the data lines DL0, DL0b and DL1, DL1b to the precharge voltage PV provided from an external source. Pursuant to the equalizing signal DLEQ, the equalizing unit 13 electrically connects the data lines DL0, DL0b and DL1, DL1b, respectively.

The operation of the FIG. 1 sense amplifier is described with reference to FIGS. 1, 2, 3A and 3B. In a precharge period, the PMOS transistors PM1–PM4 of the precharge unit 12 and the PMOS transistors PM5–PM6 of the equalizing unit 13 are turned on in accordance with the equalizing signal DLEQ of a low level. The data lines DL0, DL0b and DL1, DL1b are electrically connected by the equalizing unit 13 and the precharge unit 12 at the same time. The precharge unit 12 precharges all data lines to the precharge voltage PV. As a result, the data lines DL0, DL0b and DL1, DL1b have a potential of the precharge voltage PV. When the precharging operation is completed, the precharge unit 12 and the equalizing unit 13 are disabled by the equalization signal (DLEQ) of a high level.

In a sensing period, the pull-down amplifiers 10, 11 are enabled by the sense amplifier enable signal SAEN. The pull-down amplifier 10 senses the data read from the memory cell on input terminals IN0, IN0b, which are applied to the gates of the NMOS transistors NM1, NM2. The pull-down amplifier 11 senses the data read from the memory cell on input terminals IN1, IN1b, which are applied to the gates of NMOS transistors NM4, NM5. The amplifier 10 amplifies the voltage difference at the input terminals IN0, IN0b such that a voltage difference of PV–Vss exists between the data lines DL0, DL0b, as shown in FIG. 3A. Similarly, the amplifier 11 amplifies the voltage difference at the input terminals IN1, IN1b such that a voltage difference of PV–Vss exists between the data lines DL1, DL1b, as shown in FIG. 3B.

Thereafter, the precharge unit 12 and equalizing unit 13 are turned on to perform a precharging operation such that all data lines DL0, DL0b, and DL1, DL1b are recharged to the precharge voltage PV. The precharging operation and the sensing operation are repeatedly performed, and the data read from the memory cell are provided through the data lines DL0, DL0b and DL1, DL1b after being amplified in the pull-down amplifiers 10, 11. Accordingly, the reading operation from the memory cells is performed.

However, the above-described sense amplifier has various disadvantages. One disadvantage is the large electric power consumption. That is, during the sensing operation, one of the data lines DL0, DL0b and one of the data lines DL1, DL1b decreases to PV–ΔV and then are precharged with the precharge voltage PV again during the subsequent precharge operation, At this time, the current flow is generated. As a result, electric current is continuously consumed in both the precharge operation and the sensing operation.

SUMMARY OF THE INVENTION

An object of the present invention is to solve the various disadvantages and problems of the background and/or prior art.

Another object is to reduce electric power consumption.

A further object of the invention is to recycle the charge consumed in a sensing period during a precharge period.

To achieve the above-described objects in a whole or in parts, there is provided a sense amplifier including a pair of data lines connected with the respective output terminals of a pull-up amplifier and being respectively set at voltage levels identical to and higher than a precharge voltage by a sensing operation of the pull-up amplifier in a sensing period, and a pair of data lines connected with the respective output terminals of a pull-down amplifier and being respectively set at voltage levels identical to and lower than the precharge voltage by a sensing operation of the pull-down amplifier in a sensing period. The sense amplifier in accordance with the preferred embodiment is characterized by recycling the charge consumed in a sensing period by electrically connecting the above-described two pairs of data lines respectively during a succeeding precharge period.

The present invention may be achieved in a whole or in parts by a circuit for amplifying data provided from a memory device, comprising a control circuit that controls an operation of the circuit in one of a first mode during a first period and a second mode during a second period, a first signal line coupled to the control circuit; a second signal line coupled to the control circuit; a first amplifier coupled to the first signal line at an output of the first amplifier such that the first signal line is raised from a first prescribed potential to a second prescribed potential when receiving data at an input of the first amplifier during the first mode; and a second amplifier coupled to the second signal line at an output of the second amplifier such that the second signal line is decreased from the first prescribed potential to a third prescribed potential when receiving data at an input of the first amplifier during the first mode, wherein the second and third prescribed potentials are substantially opposite potential levels and the control circuit couples the first and second signal lines during the second mode such that charges corresponding to the substantially opposite potential levels are recycled for substantially returning the first and second signal lines to about the first prescribed potential.

The present invention may be achieved in a whole or in parts by a sense amplifier circuit coupled to receive data from a memory device and amplifying the data onto a plurality of data lines during a prescribed operation of the memory device, the sense amplifier circuit comprising a first amplifier coupled for receiving the data and coupled to corresponding one of data lines, the first amplifier raising the corresponding data line from a first prescribed potential to a second prescribed potential when receiving data; and a second amplifier coupled for receiving the data and coupled to corresponding one of data lines, the second amplifier decreasing the corresponding data line from the first prescribed potential to a third prescribed potential when receiving data, wherein the second and third prescribed potentials are substantially opposite potential levels.

The present invention may be achieved in a whole or in parts by an equalizing unit for electrically coupling first and second signal lines of a memory device during a prescribed operation, the equalizing unit comprising a first transistor coupled to the first and second signal lines; and a first plurality of transistors coupled in series, coupled to corresponding first and second signal lines and coupled to the first transistor, the first plurality of transistors and the first transistor coupled for receiving a control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
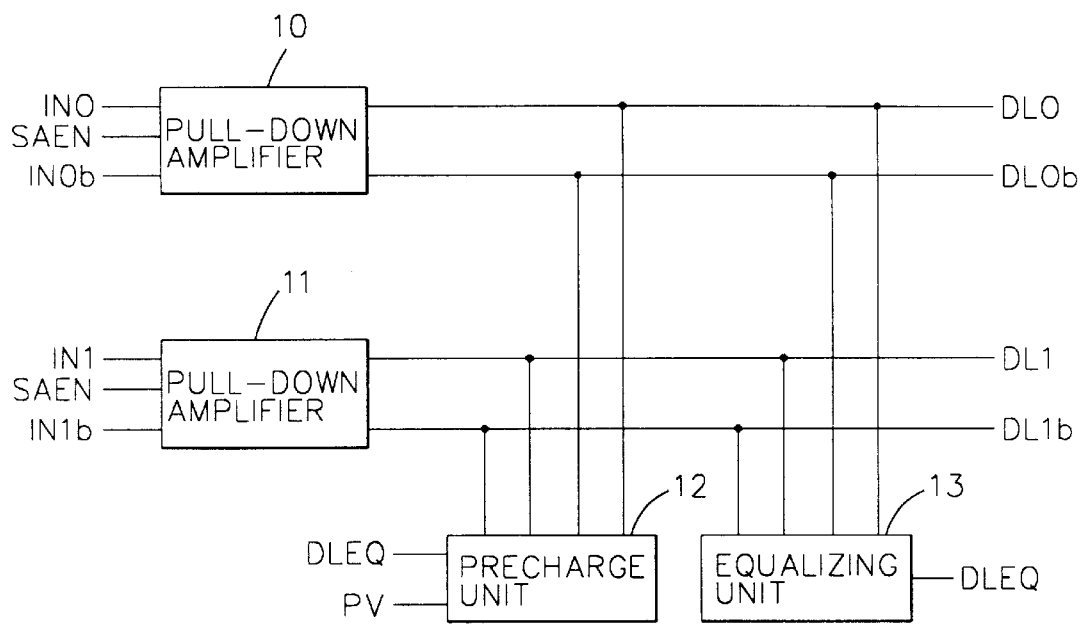
FIG. 1 is a block diagram of a sense amplifier in accordance with the background art.
Figure 2:
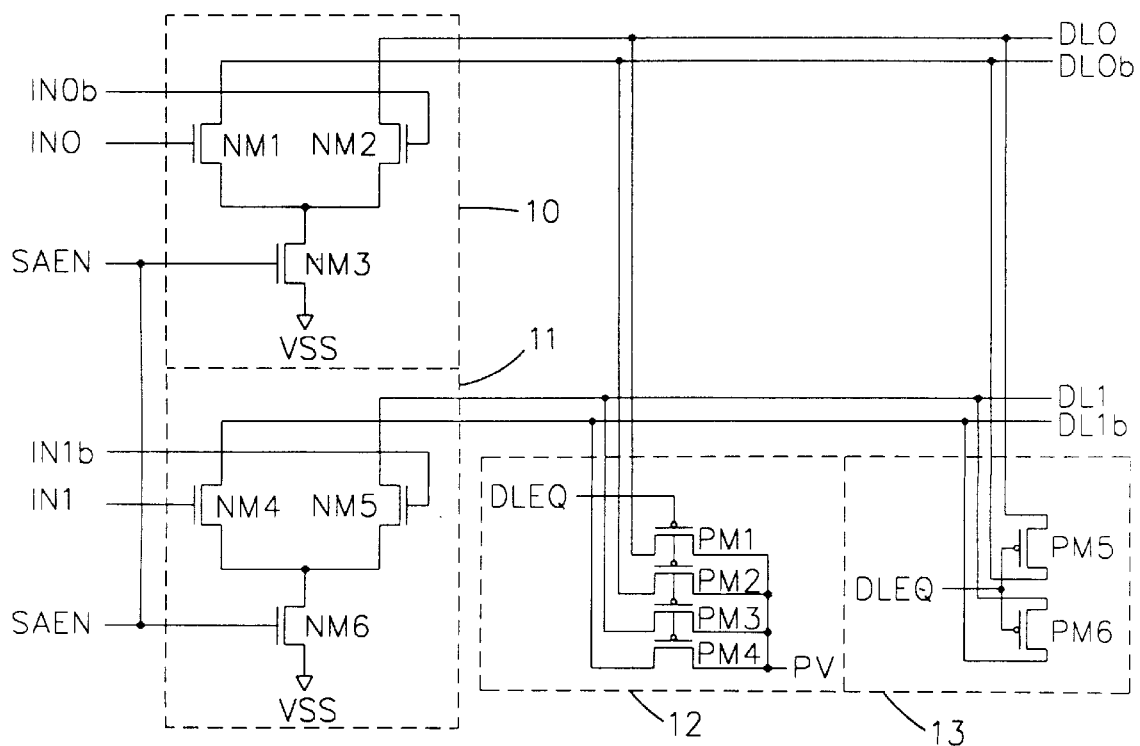
FIG. 2 is a detailed circuit diagram of the sense amplifier in FIG. 1.
Figure 3A:
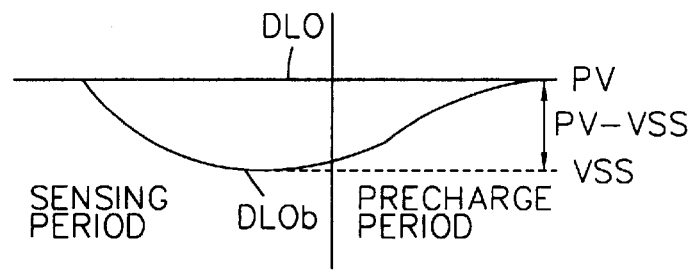
FIGS. 3A and 3B illustrate the voltage level of each data line of the sense amplifier illustrated in FIG. 1.
Figure 3B:
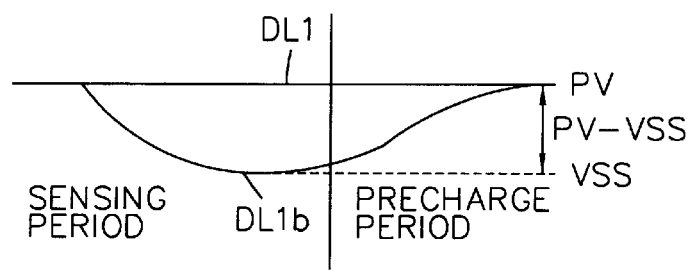
Figure 4:
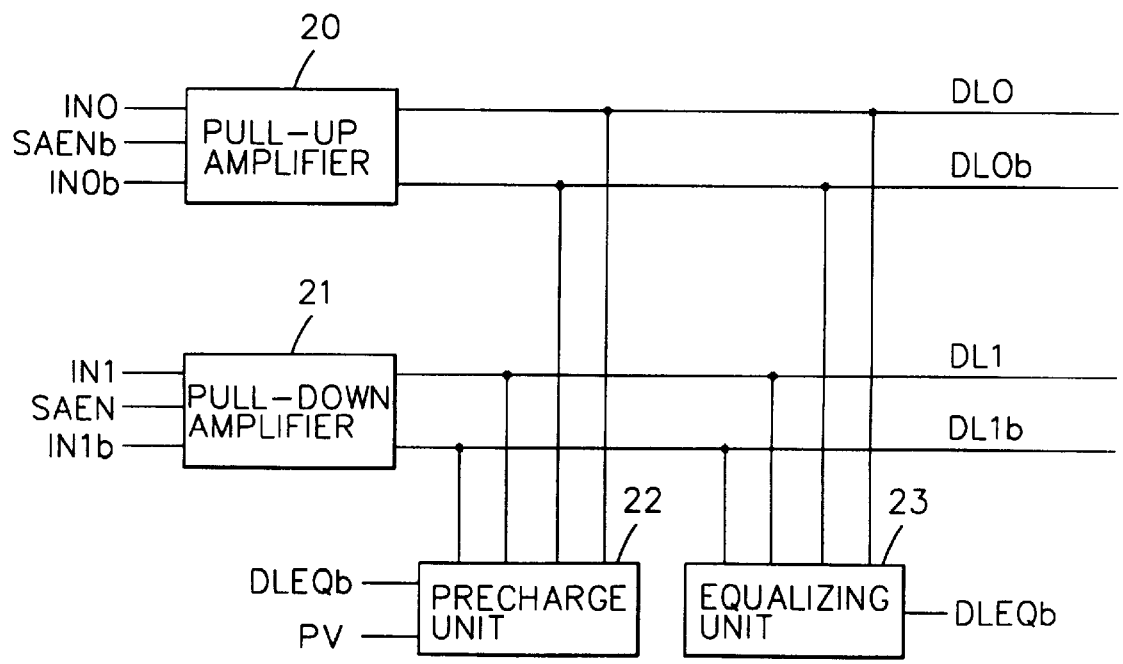
FIG. 4 is a block diagram of a sense amplifier with charge recycling in accordance with a preferred embodiment of the present invention.
Figure 5:
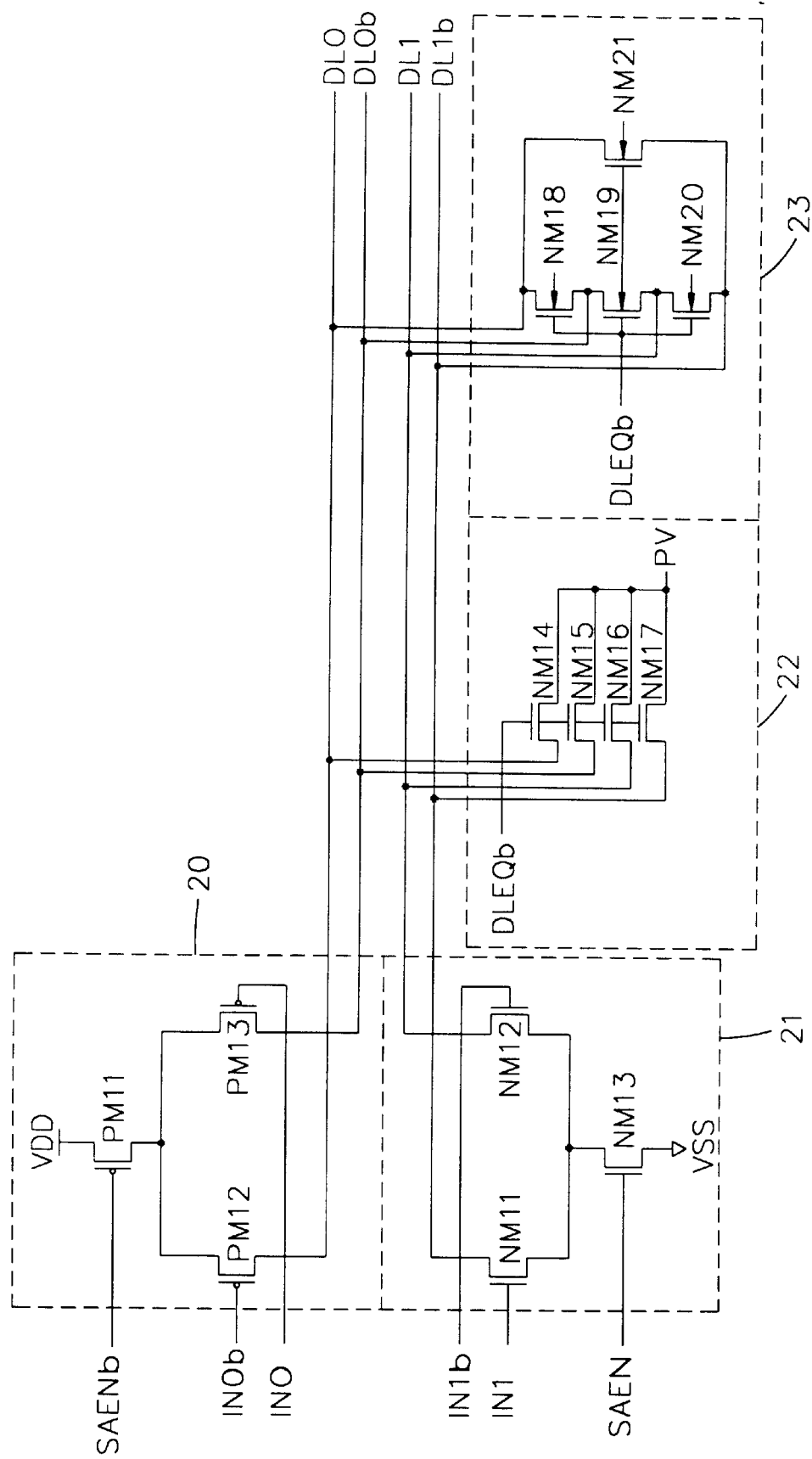
FIG. 5 is a detailed circuit diagram of the sense amplifier with charge recycling in FIG. 4.

FIG. 4 is a block diagram of a circuit in accordance with a preferred embodiment for sensing the voltage difference at input terminals IN0, IN0b and IN1, IN1b, which receive data from corresponding memory cells of a memory device such that a read operation is performed. This circuit preferably allows charge recycling between the data lines DL0, DL0b, and DL1, DL1b during the precharge period. FIG. 5 is a detailed circuit diagram of the circuit illustrated in FIG. 4.

A pull-up amplifier 20 includes a pair of input terminals and a pair of output terminals, and makes the voltages of the output terminals coupled to the data lines DL0, DL0b identical to and higher than the precharge voltage PV, respectively, when sensing the data read from a memory cell on input lines IN0, IN0b.

The pull-up amplifier 20 includes PMOS transistors PM11–PM13. The PMOS transistor PM11 comprises a source coupled to receive a power supply voltage VDD and a gate coupled to receive an inverted sense amplifier enable signal SAENb. The PMOS transistors PM12, PM13 comprise sources coupled to the drain of the PMOS transistor PM11, gates respectively coupled to receive the data signals read from the memory cells on input lines IN0b, IN0 and drains respectively coupled to data lines DL0, DL0b.

A pull-down amplifier 21 includes a pair of input terminals and a pair of output terminals, and makes the voltages of the output terminals coupled to data lines DL1, DL1b identical to and lower than the precharge voltage PV, respectively, when sensing the data read from the memory cell on input lines IN1, IN1b. The pull down amplifier 21 is enabled by a sense amplifier enable signal SAEN to sense data from a corresponding memory cell of a memory device on input terminals IN1, IN1b applied to gates of NMOS transistors NM11, NM12 respectively. The drains of NMOS transistors NM11, NM12 is coupled to the data lines DL1, DL1b, respectively, and the sources are coupled to a drain of an NMOS transistor NM13. The gate of the NMOS transistor NM13 is coupled to receive the sense amplifier enable signal SAEN, and the source is coupled for receiving a ground voltage Vss.

A control circuit for controlling the operational mode, e.g., sensing operation or precharge operation, of the sensing circuit comprises a precharge unit 22 and an equalizing unit 23. The control circuit allows recycling of the charges consumed the data lines DL0, DL0b and DL1, DL1b.

A precharge unit 22 precharges the data lines DL0, DL0b and DL1, DL1b to a precharge voltage PV, preferably applied from an external source. The precharge unit 22 comprises a plurality of NMOS transistors NM14–NM17, where each gate is coupled to receive an equalization signal DLEQb, and each source is coupled for receiving the precharge voltage PV. Further, the corresponding drains of the NMOS transistors NM14–NM17 are coupled to the data lines DL0, DL0b and DL1, DL1b.

The equalizing unit 23, when enabled by the equalizing signal DLEQb, electrically couples all the data lines DL0, DL0b and DL1, DL1b to each other. The equalizing unit 23 includes a plurality of NMOS transistors NM18–NM20 coupled in series and an NMOS transistor NM21 coupled to the NMOS transistors NM18 and 20. The source of NMOS transistor 21 is coupled to the source of NMOS transistor 18, and the drain of NMOS transistor 21 is coupled to the drain of NMOS transistor 20. To electrically couple the data lines DL0, DL0b and DL1, DL1b upon activation of the equalizing unit 23, the source of NMOS transistor NM18 is coupled to the data line DL0 and the drains of NMOS transistors NM18, NM19 and NM20; are coupled to the data lines DL0b and DL1, DL1b. The gates of the NMOS transistors NM18–NM21 are coupled for receiving the equalizing signal DLEQb.

In a precharge period, the NMOS transistors NM14–NM17 of the precharge unit 22 and the NMOS transistors NM18–NM21 of the equalizing unit 23 are turned on in response to an equalizing signal DLEQb of a high level. Since all the data lines DL0, DL0b and DL1, DL1b are electrically coupled, the data lines DL0, DL0b and DL1, DL1b are precharged to the precharge voltage PV.

In a sensing period, the precharge unit 22 and the equalizing unit 23 are disabled by the equalizing signal DLEQb of a low level. The pull-up amplifier 20 and the pull-down amplifier 21 are enabled by an inverted sense amplifier enable signal SAENb and a sense amplifier enable signal SAEN, respectively.

Figure 6A:
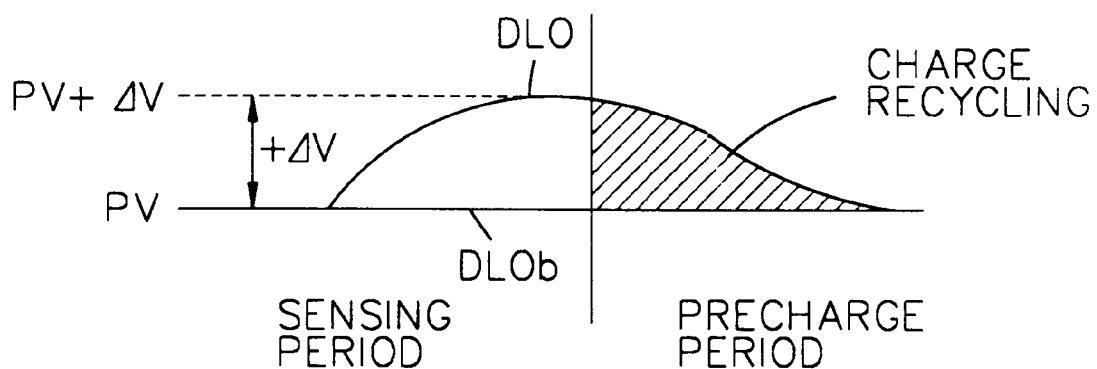
FIGS. 6A and 6B illustrate the voltage level of each data line of the sense amplifier with charge recycling in accordance with the a preferred embodiment.

The PMOS transistors PM12, PM13 of the pull-up amplifier 20 senses the data from a corresponding memory cell on input lines IN0, IN0b. As shown in FIG. 6A, the amplifier 20 amplifies the voltage difference at the input terminals IN0, IN0b such that a voltage difference of +ΔV exists between the data lines DL0, DL0b. In other words, potential of the data line DL0 rises to PV+ΔV, and the potential of the data line DL0b is maintained at PV.

Figure 6B:
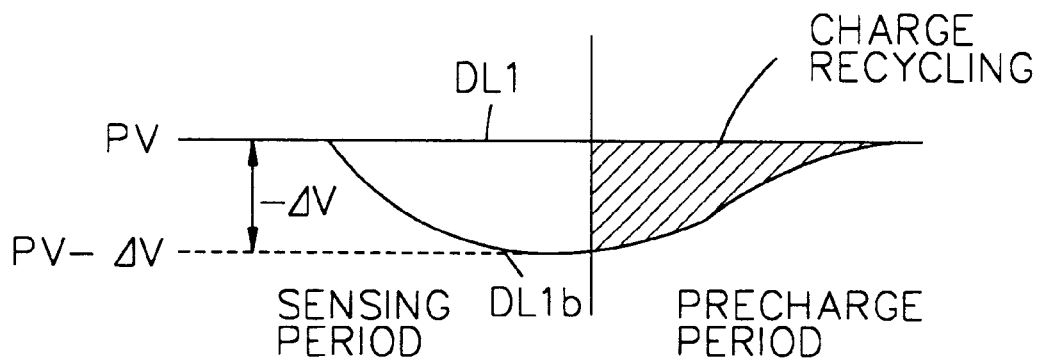

The NMOS transistors NM11, NM12 of the pull-down amplifier 21 senses the data on input lines IN1, IN1b read from a corresponding memory cell. As shown in FIG. 6B, the amplifier 21 amplifies the voltage difference at the input terminals IN1, IN1b such that a voltage difference −ΔV exists between the data lines DL1, DL1b. In other words, the potential of the data line DL1b decreases to PV−ΔV, and the potential of the data line DL1 is maintained at PV.

In the next precharge period, the equalizing unit 23 is enabled, and the data lines DL0, DL0b and DL1, DL1b are precharged. More specifically, in the precharge period, the equalizing unit 23 is enabled by the enable signal DLEQb, and thus the transistors NM18~NM21 are turned on. Thus, the data lines DL0, DL0b and the data lines DL1, DL1b are equalized. As a result, the data lines DL0, DL0b and DL1, DL1b due to the equalization operation are precharged, and the electric charges used during the sensing operation are recycled in the precharge operation.

In other words, during the sensing operation, the potential of one of the data lines DL0, DL0b rises to PV+ΔV and the potential of one of the data lines DL1, DL1b decreases to PV−ΔV. In the precharge period, if the equalizing unit 23 is enabled by the enable signal DLEQb, the data lines DL0, DL0b and the data lines DL1, DL1b are equalized. Thus, the data lines DL0, DL0b and the data lines DL1, DL1b are precharged to PV, and thus the current flow by the precharge voltage PV is not generated. The present invention recycles the charge(+ΔV) to precharge the corresponding data line of pull down amplifier 21 which is decreased to PV−ΔV.

As discussed, the equalizing unit electrically couples all the data lines DL0, DL0b and DL1, DL1b. Since there is a potential difference of +ΔV between data lines DL0, DL0b and a potential difference of −ΔV between data lines DL1, DL1b, the charge consumed during the sensing period is recycled. Hence, the data lines DL0, DL0b and DL1, DL1b are precharged to the precharge voltage PV without additional consumption of power. In other words, the electric current flowing during the precharge period is little, and the electric current flows mostly during the sensing period.

For example, when the precharge voltage is set to 1.25V, and the voltage difference |ΔV| between the data lines is 150 mV, the following result as shown in Table 1 is obtained.

TABLE 1

|  | Electric current flowing in a sensing period | Electric current flowing in a precharge period | Total Electric current |
| --- | --- | --- | --- |
| The conventional art | 6.2 mA | 7.7 mA | 13.9 mA |
| The present invention | 6.2 mA | ~0 | 6.2 mA |

In accordance with the preferred embodiment of the present invention, electric power is not consumed during both the sensing period and precharge period, but only during a sensing period. As a result, the present invention preferably reduces electric power consumption by 50% or more. Alternatively, the present invention is applicable to an amplifier having only one output terminal.

As explained above in detail, the present invention is capable of recycling the charge consumed in a sensing period by electrically connecting the two pairs of data lines respectively in a succeeding precharge period. Consequently, the present invention serves to reduce the consumption of electrical power during precharging.

The present invention provides a pair of first data lines, respectively at voltage levels identical to and higher than the precharge voltage by the sensing operation of the pull-up amplifier, and a pair of second data lines, respectively at voltage levels identical to and lower than the precharge voltage by the sensing operation of the pull-down amplifier. During a precharge period, the charge on the previously pulled-up data lines can be recycled by electrically connecting the two pairs of data lines, respectively.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit for amplifying data provided from a memory device, comprising:

a control circuit that controls an operation of the circuit in one of a first mode during a first period and a second mode during a second period;

a first signal line coupled to said control circuit;

a second signal line coupled to said control circuit;

a first amplifier coupled to said first signal line at an output of said first amplifier such that said first signal line is raised from a first prescribed potential to a second prescribed potential when receiving data at an input of said first amplifier during the first mode; and a second amplifier coupled to said second signal line at an output of said second amplifier such that said second signal line is decreased from the first prescribed potential to a third prescribed potential when receiving data at an input of said first amplifier during the first mode, wherein the control circuit includes an equalizing unit having an equalizer transistor coupled to the first and second signal lines and a first plurality of transistors coupled to the equalizer transistor and coupled in series, each of the first plurality of transistors having first and second electrodes coupled to one of the first and second signal lines, and the second and third prescribed potentials are substantially opposite potential levels and said control circuit couples said first and second signal lines during the second mode such that charges corresponding to the substantially opposite potential levels are recycled for substantially returning said first and second signal lines to about the first prescribed potential.

2. The circuit of claim 1, wherein said first signal line comprises a first pair of signal lines, and second signal line comprises a second pair of data lines.

3. The circuit of claim 2, wherein said first amplifier comprises first, second and third transistors of a first type, said first transistor coupled for receiving a first voltage, said second and third transistors coupled to said first transistor and corresponding one of said first pair of data lines, said second and third transistors coupled for receiving corresponding data.

4. The circuit of claim 3, wherein second amplifier comprises first, second and third transistors of a second type, said first transistor coupled for receiving a second voltage, said second and third transistors coupled to said first transistor and corresponding one of said second pair of data lines, said second and third transistors coupled for receiving corresponding data.

5. The circuit of claim 4, wherein said first, second and third transistors of the first type are PMOS transistors, and said first, second and third transistors of the second type are NMOS transistors.

6. The circuit of claim 4, wherein said first voltage is a source voltage, and said second voltage is a ground voltage.

7. The circuit of claim 1, wherein said first amplifier is a pull-up amplifier.

8. The circuit of claim 1, wherein said second amplifier is a pull-down amplifier.

9. The circuit of claim 1, wherein said control circuit further comprises a precharge, and during the second mode, said equalizing unit electrically couples said first and second signal lines and said precharge unit precharges the first and second signal lines to the first prescribed potential.

10. The circuit of claim 9, wherein said precharge unit comprises a second plurality of transistors, each transistor having first and second electrodes and a gate electrode, said first electrode of said second plurality of transistors being coupled for receiving the first prescribed potential, the gate electrode of said second plurality of transistors being coupled for receiving a control signal, and the second electrode of said second plurality of transistors being coupled to corresponding one of the first and second signal lines.

11. The circuit of claim 9, wherein said first plurality of transistors and said equalizer transistor are coupled for receiving a control signal.

12. The circuit of claim 11, wherein said first signal line comprises first and second data lines and said second signal line comprises third and fourth data lines, said first plurality of transistors comprises first, second and third transistors coupled to corresponding first, second, third and fourth dat lines, said equalizer transistor being coupled to said first and fourth data lines.

13. The circuit of claim 12, wherein each of said first, second, third and equalizer transistor comprise first and second electrodes and a control electrode, the first and second electrodes of said equalizer transistor being coupled to said and fourth data line, the first electrodes of said first, second and third transistors being coupled to first, second and third data lines, the second electrodes of said first, second and third transistors being coupled to second, third and fourth data lines, wherein the gate of said first, second, third and equalizer transistors are coupled for receiving the control signal.

14. A sense amplifier circuit coupled to receive data from a memory device and amplifying the data onto a plurality of data lines during a prescribed operation of the memory device, the sense amplifier circuit comprising:

a first amplifier coupled for receiving the data and coupled to a corresponding pair of data lines, said first amplifier raising one of the corresponding data lines from a first prescribed potential to a second prescribed potential when receiving data; and a second amplifier coupled for receiving the data and coupled to another corresponding pair of data lines, said second amplifier decreasing one of the another corresponding data lines from the first prescribed potential to a third prescribed potential when receiving data, wherein the second and third prescribed potentials are substantially opposite potential levels.

15. The sense amplifier circuit of claim 14, wherein said first amplifier comprises first, second and third transistors, each having first and second electrodes and a control electrode, said first electrode of said first transistor coupled for receiving a first voltage and the control electrode of said first transistor coupled for receiving a control signal, the first electrode of said second and third transistor being coupled to the second electrode of said first transistor and the control electrode of said second and third transistors being coupled for receiving the data, and the second electrode of said second and third transistors being coupled to the corresponding data line.

16. The sense amplifier circuit of claim 14, wherein said second amplifier comprises first, second and third transistors, each having first and second electrodes and a control electrode, said first electrode of said first transistor coupled for receiving a first voltage and the control electrode of said first transistor coupled for receiving a control signal, the first electrode of said second and third transistor being coupled to the second electrode of said first transistor and the control electrode of said second and third transistors being coupled for receiving the data, and the second electrode of said second and third transistors being coupled to the corresponding data line.

17. The sense amplifier circuit of claim 14, wherein said first amplifier is a pull-up amplifier and the second amplifier is a pull-down amplifier.

18. The sense amplifier circuit of claim 14, wherein said first amplifier is coupled for receiving a source voltage, and said second amplifier is coupled for receiving a ground voltage.

19. An equalizing unit for electrically coupling first and second signal lines of a memory device during a prescribed operation, the equalizing unit comprising:

a first transistor coupled to said first and second signal lines; and a first plurality of transistors coupled in series, each of the first plurality of transistors having first and second electrodes coupled to corresponding first and second signal lines and coupled to the first transistor, said first plurality of transistors and said first transistor coupled for receiving a control signal.

20. The circuit of claim 19, wherein said first signal line comprises first and second data lines and said second signal line comprises third and fourth data lines, said first plurality of transistors comprises second, third and fourth transistors coupled to corresponding first, second, third and fourth data lines, said first transistor being coupled to said first and fourth data lines.

21. The circuit of claim 20, wherein each of said first, second, third and fourth transistors comprise a control electrode, said transistor includes first and second electrodes being coupled to said first and fourth data lines, the first electrodes of said second, third and fourth transistors being coupled to first, second and third data lines, the second electrodes of said second, third and fourth transistors being coupled to second, third and fourth data lines, wherein the gate of said first, second, third and fourth transistors are coupled for receiving the control signal.

* * * * *